(12) United States Patent
Wang

(10) Patent No.: US 6,955,214 B2
(45) Date of Patent: Oct. 18, 2005

(54) RADIATOR WITH SEAMLESS HEAT CONDUCTOR

(76) Inventor: Dong-Mau Wang, P.O. Box No. 6-57, Junghe, Taipei 235 (TW)

( * ) Notice: Subject to any disclaimer, the term of this patent is extended or adjusted under 35 U.S.C. 154(b) by 0 days.

(21) Appl. No.: 11/003,346

(22) Filed: Dec. 6, 2004

(65) Prior Publication Data

US 2005/0126763 A1   Jun. 16, 2005

(30) Foreign Application Priority Data

Dec. 15, 2003   (TW) ............................... 92221935 U

(51) Int. Cl.$^7$ ............................................ F28D 15/00
(52) U.S. Cl. ........................... 165/104.33; 165/104.21; 165/185; 165/80.4; 361/699; 361/700; 257/715; 174/15.1
(58) Field of Search ........................... 165/182, 104.33, 165/104.21, 185, 80.3, 80.4, 104.26; 361/697, 361/699, 700; 257/714–716; 174/15.1

(56) References Cited

U.S. PATENT DOCUMENTS

| | | | | |
|---|---|---|---|---|
| 1,775,706 A | * | 9/1930 | Trane ........................... | 165/129 |
| 1,793,123 A | * | 2/1931 | Murray, Jr. .................. | 165/131 |
| 1,847,878 A | * | 3/1932 | Kleucker ..................... | 165/181 |
| 1,886,498 A | * | 11/1932 | Phelps ........................ | 165/150 |
| 1,943,557 A | * | 1/1934 | Ruthenburg et al ......... | 165/181 |
| 2,007,838 A | * | 7/1935 | Scott et al. .................... | 165/81 |
| 2,119,761 A | * | 6/1938 | Wentworth .................. | 165/150 |
| 2,195,259 A | * | 3/1940 | Ramsaur ...................... | 165/150 |
| 2,574,142 A | * | 11/1951 | Buongirno ................... | 165/77 |
| 2,726,850 A | * | 12/1955 | Buongirno ................... | 165/77 |
| 2,874,555 A | * | 2/1959 | Disinger et al. .............. | 62/525 |
| 3,189,087 A | * | 6/1965 | Wright ........................ | 165/181 |
| 3,190,353 A | * | 6/1965 | Storfer ........................ | 165/182 |
| 3,407,874 A | * | 10/1968 | Gier, Jr. ....................... | 165/151 |
| 5,309,982 A | * | 5/1994 | Aliano ......................... | 165/76 |
| 6,646,875 B1 | * | 11/2003 | Horng et al. ................. | 361/687 |
| 6,651,733 B1 | * | 11/2003 | Horng et al. ................. | 165/80.3 |
| 2002/0117295 A1 | * | 8/2002 | Shen .......................... | 165/182 |
| 2004/0194928 A1 | * | 10/2004 | Lee et al. .............. | 165/104.21 |

* cited by examiner

Primary Examiner—Terrell Mckinnon

(57) ABSTRACT

A radiator with seamless heat conductor at least consists of two heat sink modules and a heat conductor. The two heat sink modules can be jointed with each other. At jointing edges of the heat sink modules, arc slots are provided corresponding to the heat conductor thereby forming penetrating holes after jointing the two heat sink module altogether. The heat conductor is made in one unity and is seamless provided with multiple directions. When assembling, the heat conductor is placed into the arc slot on one of the heat sink module before installing the other heat sink module thereby fixedly jointing the two heat sink modules with the heat conductor clipped therein, achieving the objective in making radiator with seamless heat conductor.

6 Claims, 5 Drawing Sheets

US 6,955,214 B2

RADIATOR WITH SEAMLESS HEAT CONDUCTOR

BACKGROUND OF THE INVENTION (a) Field of the Invention

The invention relates to structural improvement combining a heat sink module and a heat conductor, more particularly to maintain integrity of the heat conductor without welding when assembling the heat conductor and the heat sink module so as to achieve the heat dissipating effect thereof.

(b) Description of the Prior Art

With the development of scientific technology, electronic products have become a necessity in our daily life. It not only enable us a more convenient life, but also provide people with useful tools in retrieving knowledge and information more easily. In general speaking, electronic products require full functions while their appearances and sizes are made to be smaller and more exquisite.

Nevertheless, the electronic product has to be particular about its speed and timing while it is working. This will cause a rapid rising of temperature of the inner driving system, which requires heat dissipating with the radiator auxiliary driving system. For example, while the computer is working, the CPU on the motherboard will easily generate extreme high temperature. If the temperature is not properly lowered, it will damage the CPU and even the computer host. Therefore, it is necessary to solve problems for heat dissipating on CPU by installing a radiator.

The most common way is directly using aluminum-extract type heat sink fin set on the CPU and add a fan on the heat sink fin to enhance the effects of heat dissipating. Nevertheless, merely applying heat sink fin and fan to the heat dissipating cannot achieve effective the purpose in heat dissipating.

Thus, some combined the heat sink fin with a heat conductor to solve the problem of heat sinking. As shown in FIG. 1, plural penetrating holes (1) are disposed on the heat sink fin (1) and insert a straight hose (12) into each penetrating hole (11). On both side of the heat sink fin (1) proceed the jointing by using a C-type arc pipe (13) and straight pipe (12). Generally it is jointed by way of welding so as to form a radiator having a heat conductor.

However, the heat conductor formed by way of welding will easily cause an improper welding while in use and lead to a crack, which will cause a leaking of the liquid or gas from an inner part of the heat conductor thus failing to remain status of vacuity therein. This process will become complicated and difficult which has made the heat conductor loose its original functions and become useless.

SUMMARY OF THE INVENTION

The present invention mainly consisting at least two heat sink modules and a heat conductor, wherein the two heat sink modules can be jointed to each other and on the joint end of the two heat sink modules separately set several arc grooves corresponding to the heat conductor and for the heat conductor to load and to make the two heat sink modules jointed to form plural penetrating holes. The heat conductor is made in one unity without any seam and has features of multiple directions.

The objective of the invention is to provide a multiple directional heat conductor to the arc groove of the heat sink module and then is fixed by inserting another heat sink module so as to make the heat conductor joint with the heat sink module. So the heat conductor on the heat sink module has features of seamless to ensure the liquid and gas not to leak from the inner part of the heat conductor or to remain status of vacuity.

To better understand the functions, structure and characteristics of the invention, detailed descriptions of a preferred embodiment shall be given with the accompanying drawings below.

DETAILED DESCRIPTION OF THE PREFERRED EMBODIMENTS

Figure 1:
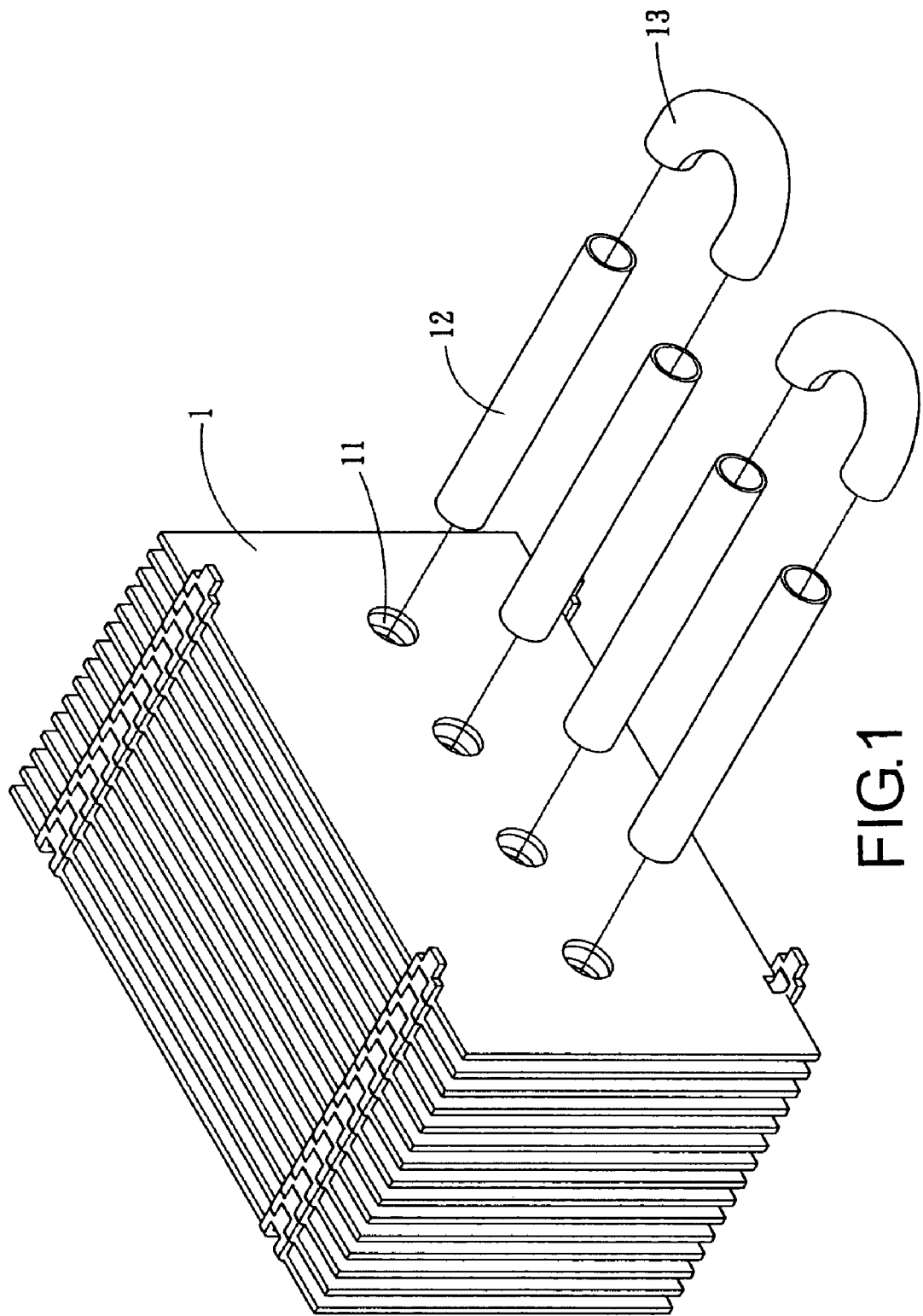
FIG. 1 is an exploded schematic view of the conventional invention.
Figure 2:
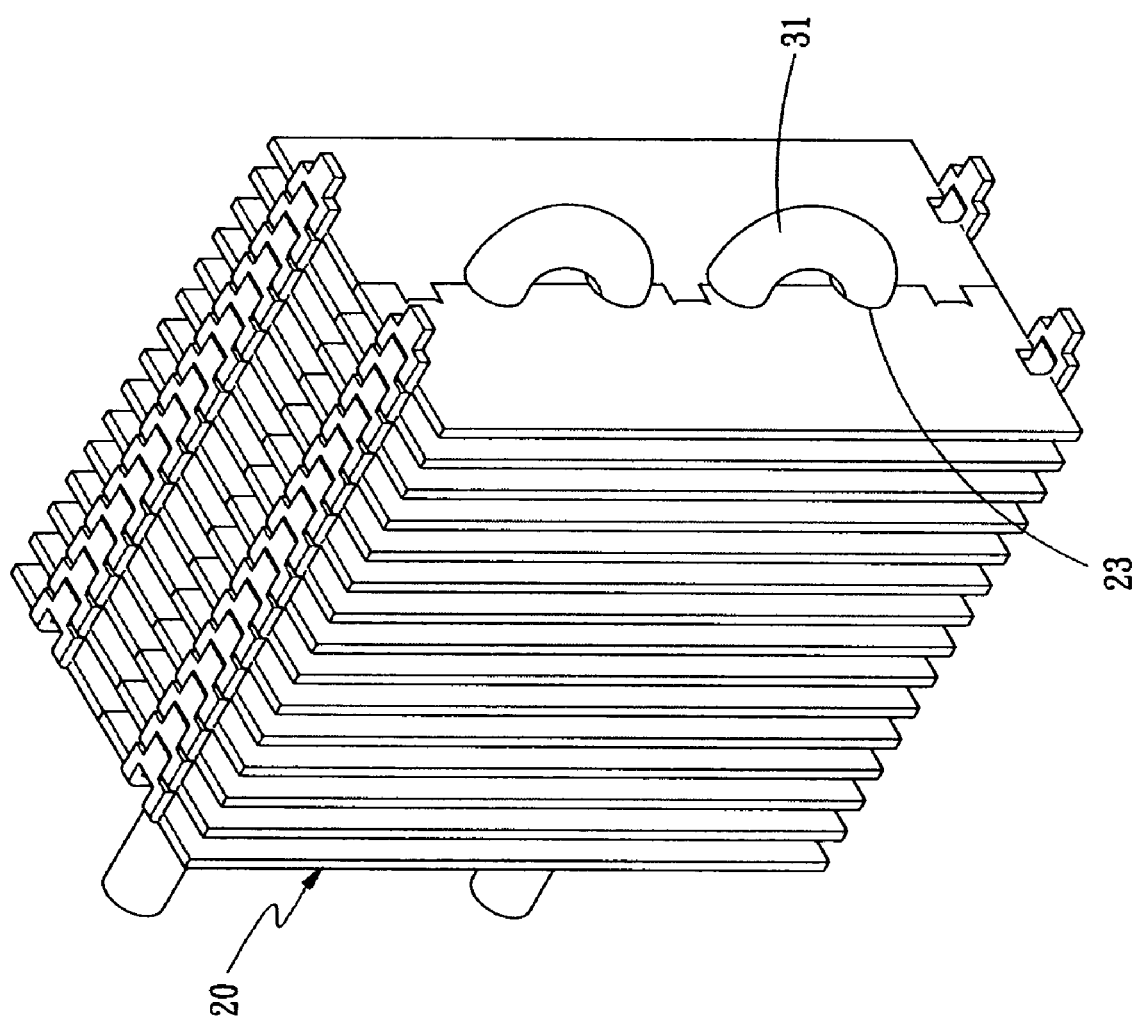
FIG. 2 is a perspective schematic view of the invention.
Figure 3:
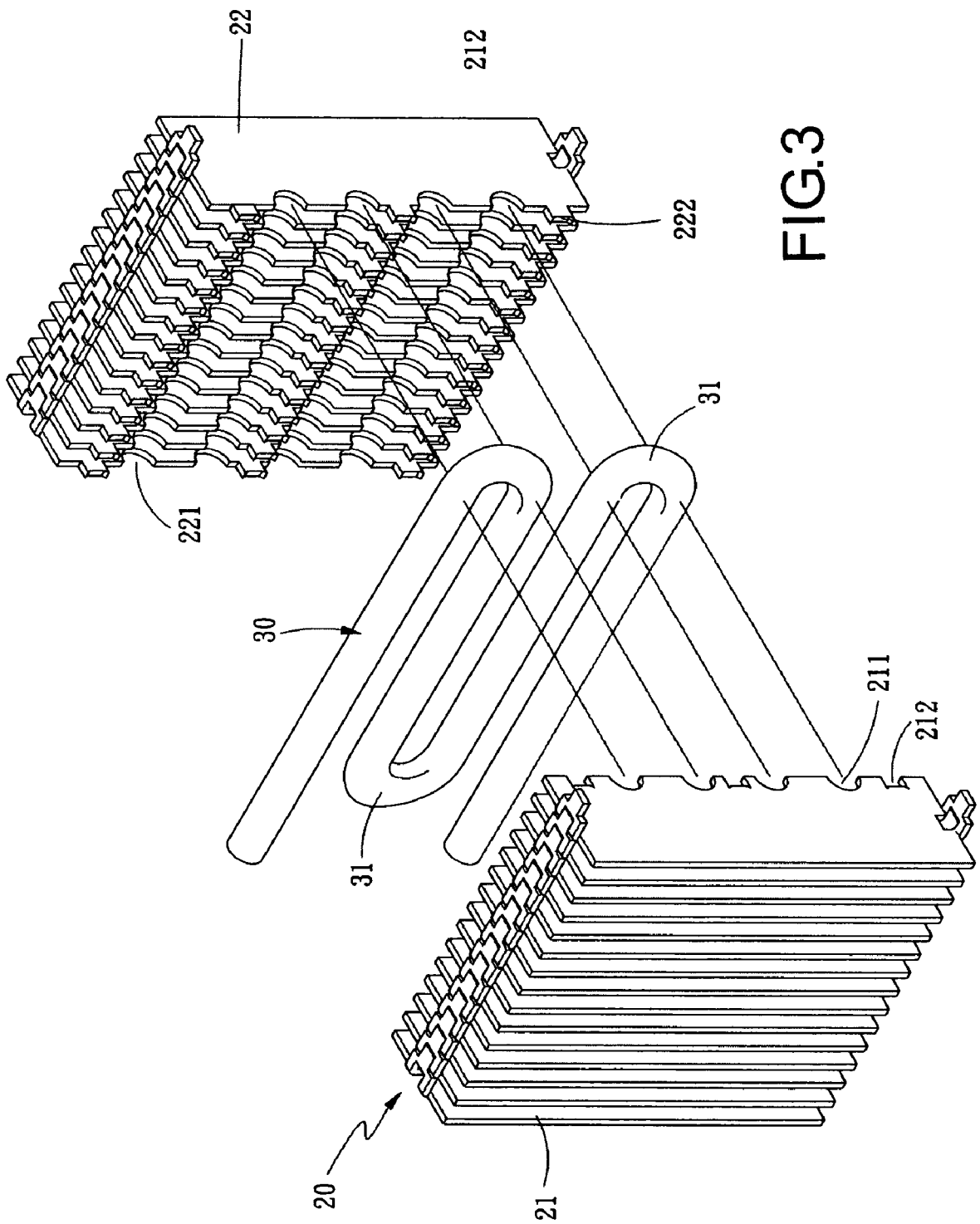
FIG. 3 is an exploded schematic view of the invention.

As shown as FIG. 2 and FIG. 3, the present invention includes at least consists a heat sink module (20) and a heat conductor (30). A heat sink module (20) further consists of an inter-jointing first heat sink module (21) and second heat sink module (22). The first heat sink module (21) and the second heat sink module (22) are composed by a plurality of heat sink fins. At a joint end of the first heat sink module (21) and the second heat sink module (22) are respectively disposed with a plurality of corresponding arc groove (211, 221), so as to form a plurality penetrating hole (23) on the heat sink module (20) by jointing the first heat sink module (21) and the second heat sink module (22).

The heat conductor (30) is formed in one unity with bending in advance to form a plural bending sections (31) corresponding to the penetrating hole (23) on the heat sink module (20).

The heat conductor (30) in bent shape is disposed into the penetrating hole (23) on the arc groove (211, 221) before the first heat sink module (21) and the second heat sink module (22) to be jointed fixedly so as to make the heat conductor (30) being clipped into penetrating hole (23) formed by the first heat sink module (21) and the second heat sink module (22) such that the bending section (31) can be protruded on an outer part of the heat sink module (20).

The first heat sink module (21) and the second heat sink module (22) are jointed by using relative buckle or component that can joint each other to achieve the effects of jointing, or by way of welding. The preferred embodiment of the invention is to provide at least a connecting groove (212) formed on the first heat sink module (21), and the connecting groove (212) relative to a connecting piece (222) formed on the second heat sink module (22). With jointing of connecting groove (212) and connecting piece (222), the first heat sink module (21) and the second heat sink module (22) can be jointed and fixed. However, by way of jointing and fixing of connecting groove (212) and the connecting piece (222) is merely an exercised example of the invention, not to define the technical feature of the invention.

Figure 4:
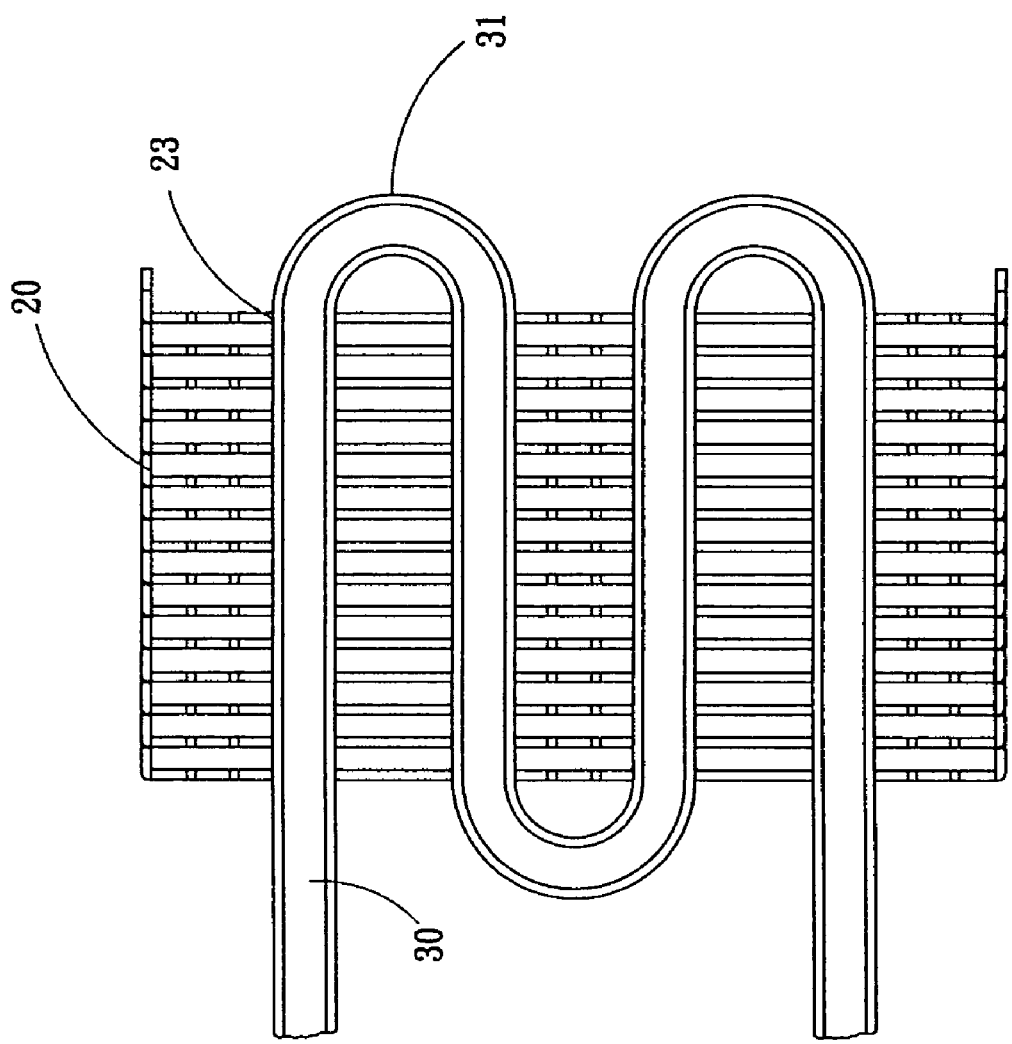
FIG. 4 is a cross-sectional schematic view of the invention.

As shown in FIG. 3 and FIG. 4, the heat conductor (30) is fixed by clipping into the penetrating hole (23) formed by the first heat sink module (21) and the second heat sink module (22). Since the heat conductor (30) is made in one unity, there will be no seam on the heat conductor (23) such that when an inner part of the heat conductor (23) is filled with liquid or gas of heat sink, it can be sure no leaking from the materials of heat sinking.

Furthermore, the heat conductor (30) can be bent in plural sections to form a plurality of bent sections (31). In this way, it will not only increase the contact surface between the heat conductor (30) and the heat sink module (20), but also enhance the effect of heat dissipating. The way of combination as illustrated is easy and simple and can greatly shorten the time of processing as well as increase the efficiency and quality of production.

Figure 5:
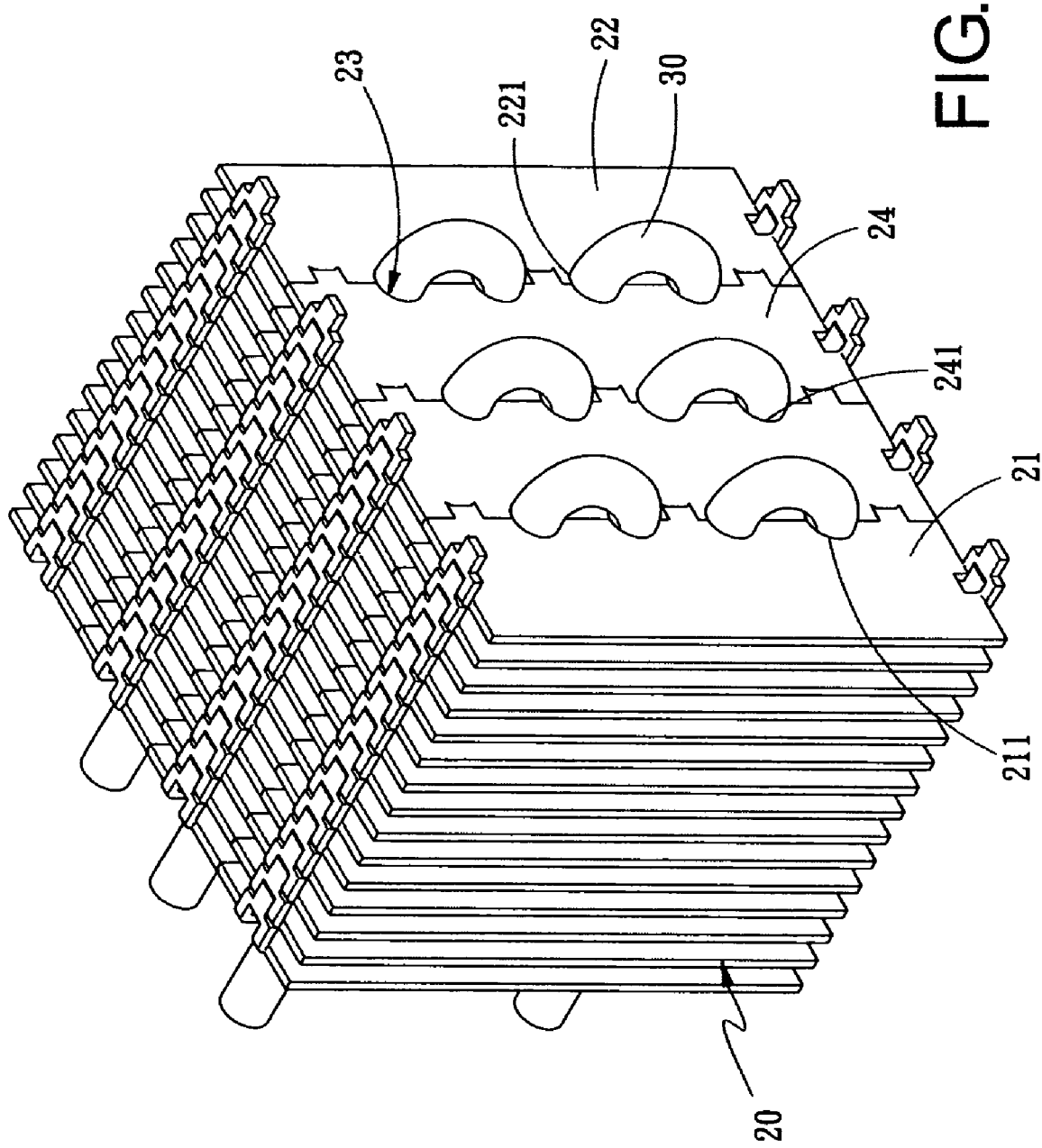
FIG. 5 is another preferred embodiment of the invention.

As shown in FIG. 5, when the heat sink module (20) is disposed on a larger space of the heat sink, the heat sink module (20) is provided with a plurality of division module (24) between the first heat sink module (21) and the second heat sink module (22). A plurality of arc groove (211,221, 241) formed on the first heat sink module (21), the second heat sink module (22) and the division module (24) provide a plurality of penetrating hole (23) thereby allowing a plurality of heat conductors (30) to insert therein. After assembly, numerous heat conductors (30) can be assembled on the heat sink module (20). It can be applied for a larger space of the heat sink, and enhance the effects of the heat sinking of the sink module.

It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. A radiator with a seamless heat conductor comprising:
a heat sink module consisting of an inter-joint of a first heat sink module and a second heat sink module; at each joint of the first heat sink module and the second heat sink module, a plurality of corresponding arc groove is provided thereby forming a plurality of penetrating hole on the heat sink module after jointing the first heat sink module and the second heat sink module; a seamless heat conductor formed in one unity provided with multiple directions, being jointed into the penetrating hole;
when assembling, the heat conductor being placed into the penetrating hole formed by the arc groove before jointing the first heat sink module and the second heat sink module thereby enabling the heat conductor fixedly clipped into the penetrating hole of heat sink module.

2. The radiator with a seamless heat conductor as claimed in claim 1, wherein, a connecting groove formed on the first heat sink module, and a connecting piece formed on the second heat sink module; the first heat sink module and the second heat sink module being jointed fixedly by the connecting piece and the connecting groove.

3. The radiator with seamless heat conductor as claimed in claim 1, wherein, the first heat sink module and the second heat sink module having a plurality of heat sink fins.

4. A radiator with seamless heat conductor at least comprising:
a heat sink module consisting of an inter-joint of a first heat sink module and a second heat sink module and at least one division module; at each joint of the first heat sink module and the second heat sink module and the division module, a plurality of corresponding arc groove is provided thereby forming a plurality of penetrating hole after jointing the first heat sink module, the second heat sink module and the division module; a seamless heat conductor formed in one unity provided with multiple directions, being jointed into the penetrating hole;
when assembling, the heat conductor being placed into the penetrating hole formed by the arc groove before jointing the first heat sink module, the second heat sink module and the division module thereby enabling the heat conductor fixedly clipped into the penetrating hole.

5. The radiator with seamless heat conductor as claimed in claim 4, wherein, the first heat sink module, the second heat sink module and the division module respectively provided with connecting groove and connecting piece thereby fixedly jointed the first heat sink module, the second heat sink module and the division module by the connecting piece and the connecting groove.

6. The radiator with seamless heat conductor as claimed in claim 4, wherein, the first heat sink module, the second heat sink module and division module having a plurality of heat sink fins.

* * * * *